(12) United States Patent
Taylor, II et al.

(10) Patent No.: US 9,239,265 B2
(45) Date of Patent: Jan. 19, 2016

(54) APPARATUS AND METHOD FOR REAL TIME MEASUREMENT OF SUBSTRATE TEMPERATURES FOR USE IN SEMICONDUCTOR GROWTH AND WAFER PROCESSING

(75) Inventors: Charles A. Taylor, II, Ann Arbor, MI (US); Darryl Barlett, Dexter, MI (US); Douglas Perry, Chelsea, MI (US); Roy Clarke, Ann Arbor, MI (US); Jason Williams, Ann Arbor, MI (US)

(73) Assignee: k-Space Associates, Inc., Dexter, MI (US)

( * ) Notice: Subject to any disclaimer, the term of this patent is extended or adjusted under 35 U.S.C. 154(b) by 840 days.

(21) Appl. No.: 12/830,810

(22) Filed: Jul. 6, 2010

(65) Prior Publication Data

US 2010/0274523 A1  Oct. 28, 2010

Related U.S. Application Data

(60) Division of application No. 12/104,938, filed on Apr. 17, 2008, now Pat. No. 7,837,383, which is a continuation of application No. 10/961,798, filed on Oct. 8, 2004, now abandoned.

(60) Provisional application No. 60/509,762, filed on Oct. 9, 2003.

(51) Int. Cl.
*G01J 3/00* (2006.01)
*G01J 3/40* (2006.01)
(Continued)

(52) U.S. Cl.
CPC ............... *G01J 5/0003* (2013.01); *C23C 16/46* (2013.01); *C23C 16/52* (2013.01); *G01J 3/10* (2013.01);
(Continued)

(58) Field of Classification Search
CPC ................ G01J 3/00; G01J 3/42; G01J 3/40; G01J 5/00; G01J 5/58

USPC .......... 374/120, 141, 126, 121, 124, 129, 43, 374/44, 57, 45, 137, 138, 130, 131, 178, 374/100, 134; 356/319, 320, 326; 438/16, 438/795, 7; 702/134, 135; 385/5
See application file for complete search history.

(56) References Cited

U.S. PATENT DOCUMENTS 4,338,516 A   7/1982   Sharma
4,367,460 A   1/1983   Hodara
(Continued)

FOREIGN PATENT DOCUMENTS

JP          61225627 A    10/1986

OTHER PUBLICATIONS

"A New Optical Temperature Measurement Technique for Semiconductor Substrates in Molecular Beam Epitaxy," MK Weilmeier et al., Department of Physics and Electrical Engineering, University of British Columbia, Canada, Can. J. Phys. 69, 422 (1991), 5 pages.

*Primary Examiner* — Gail Kaplan Verbitsky
(74) *Attorney, Agent, or Firm* — Endurance Law Group, PLC

(57) ABSTRACT

The invention is an optical method and apparatus for measuring the temperature of semiconductor substrates in real-time, during thin film growth and wafer processing. Utilizing the nearly linear dependence of the interband optical absorption edge on temperature, the present method and apparatus result in highly accurate measurement of the absorption edge in diffuse reflectance and transmission geometry, in real time, with sufficient accuracy and sensitivity to enable closed loop temperature control of wafers during film growth and processing. The apparatus operates across a wide range of temperatures covering all of the required range for common semiconductor substrates.

9 Claims, 16 Drawing Sheets

(51) Int. Cl.
*G01J 3/42* (2006.01)
*G01J 5/00* (2006.01)
*G01J 5/58* (2006.01)
*C23C 16/46* (2006.01)
*C23C 16/52* (2006.01)
*G01J 3/10* (2006.01)
*G01J 5/60* (2006.01)
*G01J 3/02* (2006.01)
*G01J 5/08* (2006.01)

(52) U.S. Cl.
CPC .............. *G01J 5/0007* (2013.01); *G01J 5/60* (2013.01); *G01J 3/024* (2013.01); *G01J 3/0286* (2013.01); *G01J 3/0291* (2013.01); *G01J 5/0821* (2013.01)

(56) References Cited

U.S. PATENT DOCUMENTS

| | | | |
|---|---|---|---|
| 4,437,761 A | 3/1984 | Kroger et al. | |
| 4,558,217 A | 12/1985 | Alves | |
| 4,703,175 A | 10/1987 | Salour et al. | |
| 4,779,977 A | 10/1988 | Rowland et al. | |
| 4,841,150 A | 6/1989 | Walter | |
| 4,883,963 A | 11/1989 | Kemeny et al. | |
| 4,890,245 A | 12/1989 | Yomoto et al. | |
| 4,979,133 A | 12/1990 | Arima et al. | |
| 5,098,199 A | 3/1992 | Amith | |
| 5,118,200 A | 6/1992 | Kirillov et al. | |
| 5,213,985 A | 5/1993 | Sandroff et al. | |
| 5,258,602 A | 11/1993 | Naselli et al. | |
| 5,282,017 A | 1/1994 | Kasindorf et al. | |
| 5,296,689 A | 3/1994 | Reddersen et al. | |
| 5,388,909 A | 2/1995 | Johnson et al. | |
| 5,506,672 A | 4/1996 | Moslehi | |
| 5,564,830 A | 10/1996 | Bobel et al. | |
| 5,568,978 A * | 10/1996 | Johnson et al. | 374/161 |
| 5,594,240 A | 1/1997 | Weiss | |
| 5,628,564 A | 5/1997 | Nenyei et al. | |
| 5,683,180 A | 11/1997 | DeLyon et al. | |
| 5,727,017 A | 3/1998 | Maurer et al. | |
| 6,002,113 A | 12/1999 | Alers et al. | |
| 6,062,729 A | 5/2000 | Ni et al. | |
| 6,082,892 A | 7/2000 | Adel et al. | |
| 6,116,779 A * | 9/2000 | Johnson et al. | 374/161 |
| 6,130,415 A | 10/2000 | Knoot | |
| 6,166,779 A | 12/2000 | Kokudo et al. | |
| 6,174,081 B1 | 1/2001 | Holm | |
| 6,222,187 B1 | 4/2001 | Shivanandan | |
| 6,449,048 B1 | 9/2002 | Olszak | |
| 6,486,675 B1 * | 11/2002 | Jaiprakash et al. | 324/533 |
| 6,577,386 B2 | 6/2003 | Yoshida et al. | |
| RE38,307 E | 11/2003 | Gustafsson et al. | |
| 6,712,502 B2 | 3/2004 | Zalameda et al. | |
| 6,786,637 B2 | 9/2004 | Kuball et al. | |
| 6,816,803 B1 | 11/2004 | Palfenier et al. | |
| 6,873,450 B2 | 3/2005 | Patel et al. | |
| 6,891,124 B2 | 5/2005 | Denton et al. | |
| 6,958,814 B2 | 10/2005 | Borden et al. | |
| 6,976,782 B1 * | 12/2005 | Steger | 374/1 |
| 7,018,094 B1 | 3/2006 | Bates | |
| 7,420,684 B2 | 9/2008 | Takeuchi et al. | |
| 7,543,981 B2 | 6/2009 | Timans | |
| 2001/0055116 A1 | 12/2001 | Maczura et al. | |
| 2003/0020997 A1 | 1/2003 | Ash | |
| 2003/0107733 A1 | 6/2003 | Oka et al. | |
| 2003/0185275 A1 | 10/2003 | Renschen et al. | |
| 2004/0061057 A1 | 4/2004 | Johnson et al. | |
| 2004/0115938 A1 | 6/2004 | Scheer et al. | |
| 2004/0170369 A1 | 9/2004 | Pons | |
| 2004/0218177 A1 | 11/2004 | MacKinnon et al. | |
| 2005/0063026 A1 | 3/2005 | Weldy et al. | |
| 2007/0051471 A1 | 3/2007 | Kawaguchi et al. | |
| 2012/0133934 A1 * | 5/2012 | Barlett | H01L 21/67248 356/326 |
| 2012/0231558 A1 * | 9/2012 | Timans | G01J 5/0003 438/7 |
| 2013/0034918 A1 * | 2/2013 | Dusemund | G01N 21/55 438/8 |
| 2013/0321805 A1 * | 12/2013 | Barlett | G01B 11/0616 356/326 |

\* cited by examiner

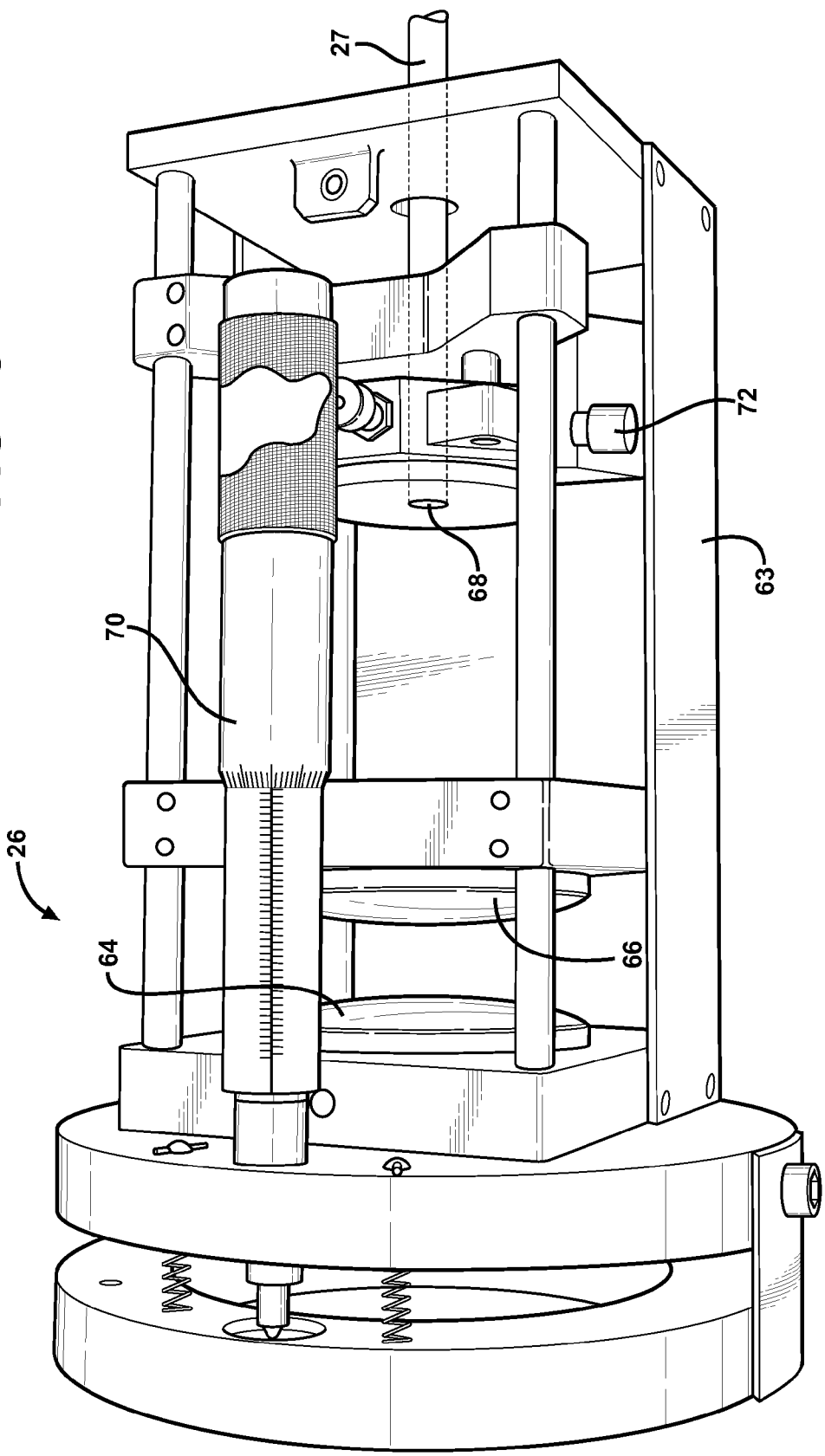

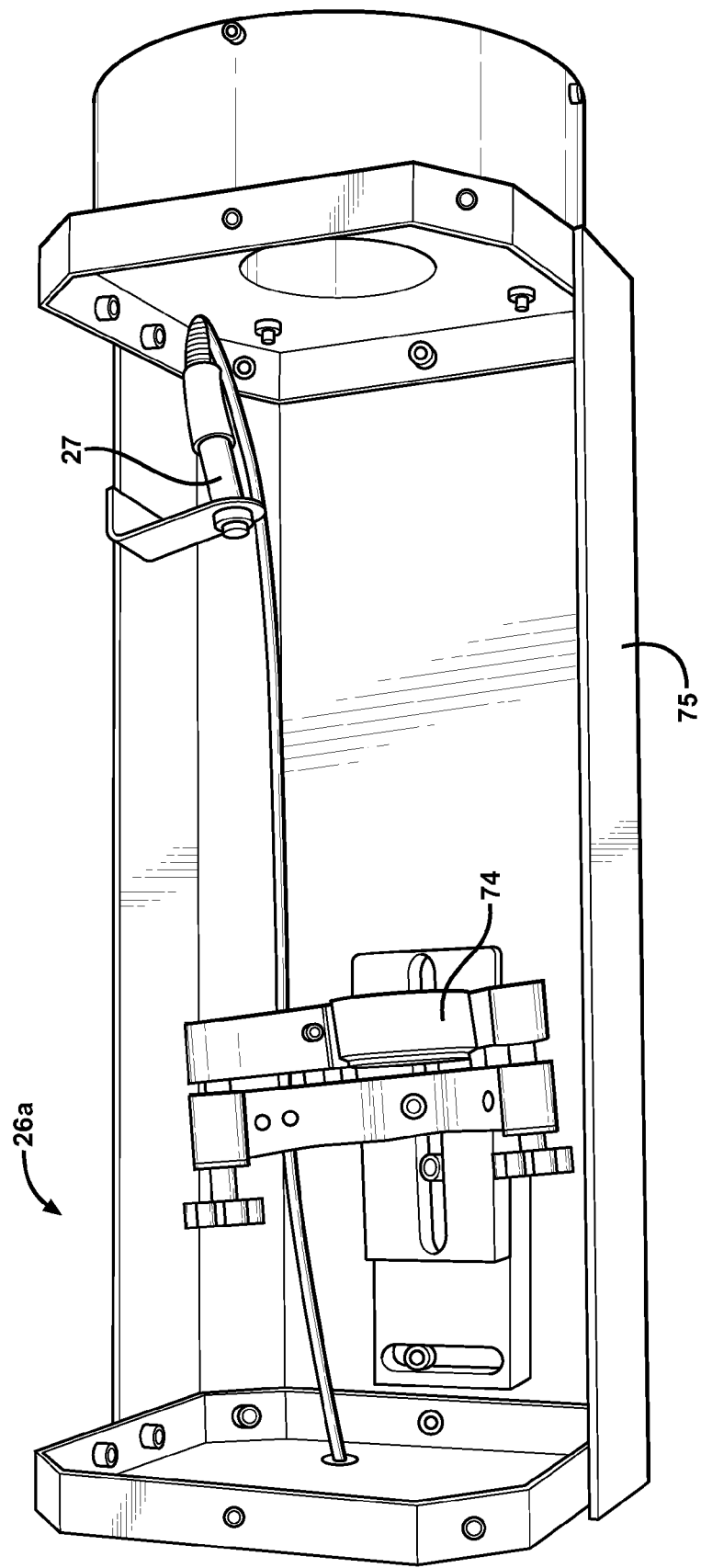

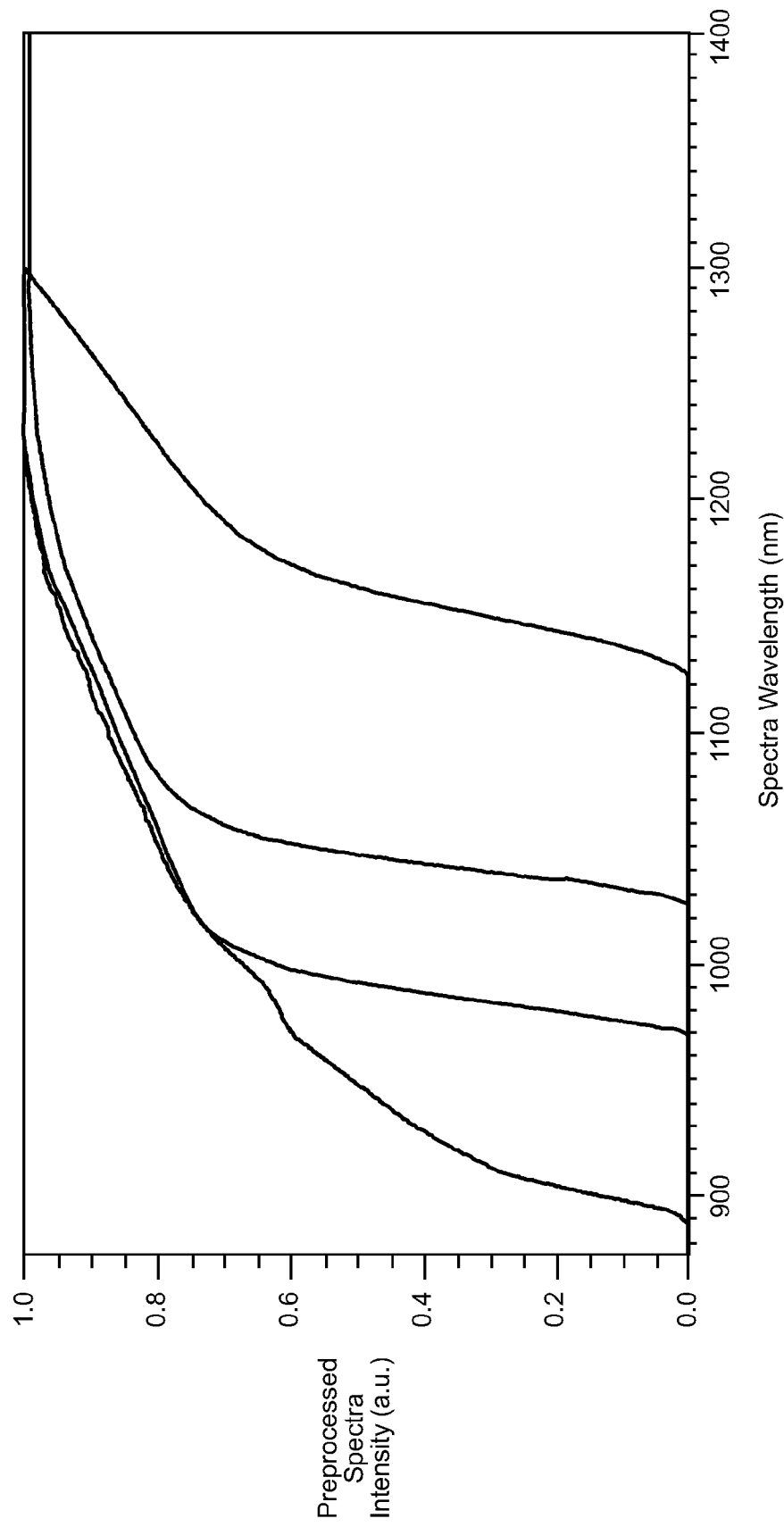

APPARATUS AND METHOD FOR REAL TIME MEASUREMENT OF SUBSTRATE TEMPERATURES FOR USE IN SEMICONDUCTOR GROWTH AND WAFER PROCESSING

CROSS REFERENCE TO RELATED APPLICATIONS

This application is a Divisional of U.S. patent application No. 12/104,938, now U.S. Pat. No. 7,837,383, which is a Continuation of U.S. patent application No. 10/961,798, filed Oct. 8, 2004, which claims the benefit of U.S. Provisional Application No. 60/509,762, filed Oct. 9, 2003.

BACKGROUND OF THE INVENTION

1. Field of the Invention

The invention relates to methods and devices for making precise non-contact measurements of the temperature of substrate materials during the growth and processing of thin films, particularly pertaining to semiconductor growth and wafer processing.

2. Related Art

Precise temperature measurement during the growth of deposited layers on a semi-conductor wafer is critical to the ultimate quality of the finished, coated wafer and in turn to the performance of the opto-electronic devices constructed on the wafer. Variations in substrate temperature, including intra-wafer variations in temperature ultimately affect quality and composition of the layers of material deposited. During the deposition process, the substrate wafer is normally heated from behind and rotated about a center axis. Typically, a resistance heater positioned in proximity to the wafer provides the heat source for elevating the temperature of the wafer to a pre-determined value. Precise control of the temperature associated with the process is most desirable, and is best achieved through precise and real-time monitoring of the substrate temperature.

An example application illustrating the necessity of precise temperature control is the formation of semiconductor nanostructures. Semiconductor nanostructures are becoming increasingly important for applications such as "quantum dot" detectors, which require the self-assembled growth of an array of very uniform sizes of nano-crystallites. This can only be accomplished in a very narrow window of temperature. Temperature uncertainties can result in spreading of the size distribution of the quantum dots, which is detrimental to the efficiency of the detector.

The growth of uniform quantum dots is an example of a thermally activated process in which the diffusion rates are exponential in temperature. Therefore, it is important to be able to measure, and have precise control over, the substrate temperature when growth or processing is performed.

Numerous methods have been disclosed for monitoring these temperatures. One simple, but largely ineffective approach has been the use of conventional thermocouples placed in proximity to, or in direct contact with the substrate during the thin film growth operation. This methodology is deficient in many respects, most notably, the slow response of typical thermocouples, the tendency of thermocouples (as well as other objects within the deposition chamber) to become coated with the same material being deposited on the semi-conductor wafer, thereby effecting the accuracy of the thermocouple, as well as the spot thermal distortion of the surface of the semiconductor wafer resulting from physical contact between the thermocouple and the substrate. In any event, the use of thermocouples near or in contact with the substrate is largely unacceptable during most processes because of the poor accuracy achieved.

Optical pyrometry methods have been developed to overcome these shortcomings. Optical pyrometry uses the emitted thermal radiation, often referred to as "black body radiation," to measure the sample temperature. The principal difficulties with this method are that samples typically do not emit sufficient amounts of thermal radiation until they are above approximately 450° C., and semiconductor wafers are not true black body radiators. Furthermore, during deposition a semiconductor wafer has an emissivity that varies significantly both in time and with wavelength. Hence the use of pyrometric instruments is limited to high temperatures and the technique is known to be prone to measurement error.

In "A New Optical Temperature Measurement Technique for Semiconductor Substrates in Molecular Beam Epitaxy," Weilmeier et al. describe a technique for measuring the diffuse reflectivity of a substrate having a textured back surface, and inferring the temperature of the semiconductor from the band gap characteristics of the reflected light. The technique is based on a simple principle of solid state physics, namely the practically linear dependence of the interband optical absorption (Urbach) edge on temperature.

Briefly, a sudden onset of strong absorption occurs when the photon energy, hv, exceeds the bandgap energy $E_g$. This is described by an absorption coefficient, $$\alpha(hv) = \alpha_g \exp[(hv-E_g)/E_0],$$

where $\alpha_g$ is the optical absorption coefficient at the band gap energy. The absorption edge is characterized by $E_g$ and another parameter, $E_0$, which is the broadening of the edge resulting from the Fermi-Dirac statistical distribution (broadening $\sim k_B T$ at the moderate temperatures of interest here). The key quantity of interest, $E_g$, is given by the Einstein model in which the phonons are approximated to have a single characteristic energy, $k_B$. The effect of phonon excitations (thermal vibrations) is to reduce the band gap according to:

$$E_g(T) = E_g(0) - S_g k_B \theta_E [\exp(\theta_E/T) - 1]$$

where $S_g$ is a temperature independent coupling constant and $\theta_E$ is the Einstein temperature. In the case where $\theta_E \gg T$, which is well-obeyed for high modulus materials like Si and GaAs, one can approximate the temperature dependence of the band gap by the equation:

$$E_g(T) = E_g(0) - S_g k_B T,$$

showing that $E_g$ is expected to decrease linearly with temperature T with a slope determined by $S_g k_B$. This is well obeyed in practice and is the basis for the band edge thermometry.

Variations on this methodology are taught by Johnson et al., in U.S. Pat. Nos. 5,388,909, and 5,568,978. These references teach the utilization of the filtered output of a wide spectrum halogen lamp which is passed through a mechanical chopper, then passed through a lens, then through the window of high vacuum chamber in which the substrate is located, and in which the thin film deposition process is ongoing. Located within the chamber is a first mirror which directs the output of the source to the surface of the substrate. The substrate is being heated by a filament or a similar heater which raises the temperature of the substrate to the optimum level required for effective operation of the deposition process. A second mirror located within the chamber is positioned to reflect the non-specular (i.e., diffuse) light reflected from the back surface of the substrate, said reflection being directed to another window in the chamber and thence through a lens to a detection system comprising a spectrometer. The wavelengths of the elements of the non-specular reflection are utilized to determine the band gap corresponding to a particular temperature. Johnson et al. teach that the temperature is determined from the "knee" in the graph of the diffuse reflectance spectrum near the band gap.

While the prior art is in some ways effective, use of optical fiber bundles, intra chamber optics, mechanical light choppers and mechanically scanned spectrometers renders the methodology deficient in many respects. The detected signal suffers from temporal degradation of the optics within the deposition chamber. The mechanical components are overly susceptible to failure and the overall methodology of collecting the signal is simply too slow for real-time measurement and control applications in the industrial production environment. In addition, the described means of the prior art is subject to variations in accuracy dependent upon the fluctuation, over time, of the output of the halogen light source.

Specifically, the prior art relies on one or more optical elements within the deposition chamber to direct the incident light to the wafer and to collect the diffusely reflected light. The presence of optics within the deposition chamber is problematic, since the material being deposited during the coating process tends to coat all of the contents of the chamber, including the mirrors, lenses, etc. Over time the coatings build up and significantly reduce the collection efficiency of the optics and can lead to erroneous temperature measurement.

More importantly, the prior art relies on a mechanical light chopper and a mechanical scanning spectrometer for measurement of the light signal. Not only do the mechanical components fail frequently with extended use, but it is well known that gears in scanning spectrometers wear, resulting in continual shifts in the wavelength calibration. This leads to perpetually increasing errors in temperature measurement unless the instrument is recalibrated frequently, which is a very time consuming process. In addition, it is well known that scanning spectrometers are quite slow, requiring anywhere from 1-5 seconds to complete a single scan. In most deposition systems the semiconductor wafers are rotating, typically at 10-30 RPM. In this case, a temperature measurement that takes 1-5 seconds to complete is by default an average temperature and it is impossible to make any type of spatially resolved measurement. If the process chamber has many wafers rotating on a platter about a common axis, as is typical in a production deposition system, the slow response time of the prior art makes it impossible to monitor multiple wafers.

Furthermore, the prior art utilizes a quartz halogen light source with no consideration of any type of output stabilization or intensity control. Quartz halogen lamps are known to degrade rapidly over time leading to fluctuations in the lamp output that result in measurement variations and further system downtime for lamp replacement.

Basically, the many limitations of the prior art have limited the applications of diffuse reflectance or "band edge" thermometry in the commercial setting.

SUMMARY OF THE INVENTION

The invention is an optical method and apparatus for measuring the temperature of semiconductor substrates, in real-time during thin film growth and wafer processing, utilizing the nearly linear dependence of the interband optical absorption edge on temperature.

The present invention utilizes simple, efficient collection optics, external to the deposition system, connected via a single small core optical fiber to a solid state array spectrometer. The system requires no mechanical light chopper or other means to modulate the light signal. The invention can operate in one of three modes: 1.) the above described diffuse scattering reflectance mode, by utilizing a unique feedback controlled, stabilized light source that has all optics completely external to the deposition system. 2.) transmission mode with external light source or 3.) transmission mode utilizing the substrate heater as a light source (requiring no external light source).

The invention utilizes sophisticated software algorithms to analyze diffusely scattered light from the semiconductor substrate to accurately and precisely determine the wavelength position of the optical absorption edge. The measured position of the absorption edge is compared to calibration data using a multi-order polynomial equation that is specific to each semiconductor wafer material. The data acquisition speed and software algorithms are fast enough to provide typical temperature sampling rates of 20 Hz or better. The invention operates across a wide range of temperatures covering all of the required range for growth on common substrates, including GaAs, Si, InP, ZnSe, and other semiconductor wafers. In particular, the system design is optimized for the temperature regime between ambient and ~700° C. that is not currently served by existing non-contact sensors (e.g., pyrometer-type sensors).

BRIEF DESCRIPTION OF THE DRAWINGS

FIG. 3 is a top perspective view of one embodiment of the detector assembly, that which utilizes lenses for collection and imaging the diffusely scattered light, showing the respective placement of the optics and collection fiber.

FIG. 4 is a top perspective view of a second embodiment of the detector assembly, which utilizes a single focusing minor for collection and imaging of the diffusely scattered light, showing the respective placement of the minor and collection fiber.

FIG. 5B is a graph showing the spectra of FIG. 5A after the spectra have been preprocessed to remove background light below the absorption edge and normalize the maximum intensity.

DETAILED DESCRIPTION OF THE PREFERRED EMBODIMENT

Figure 1:
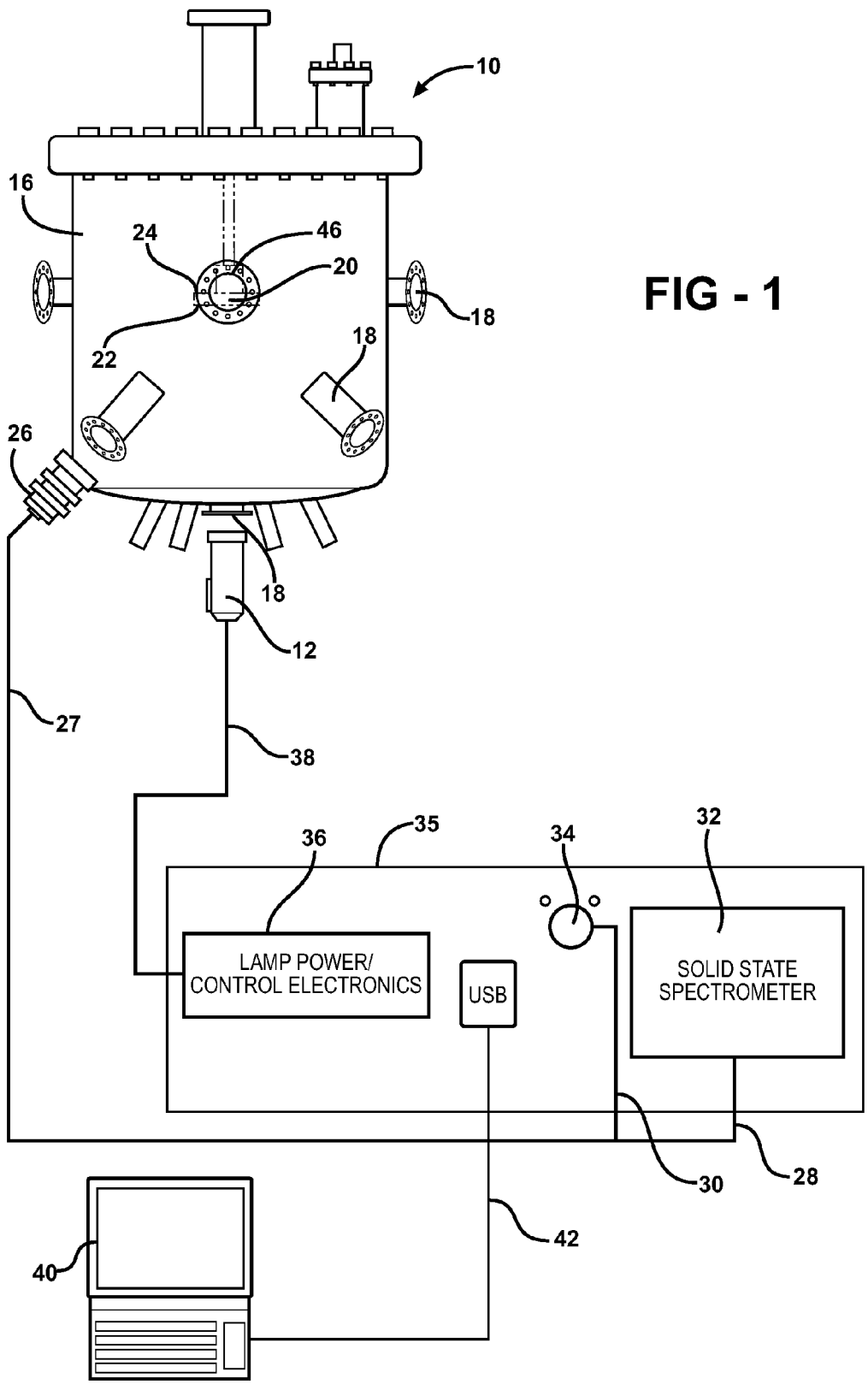
FIG. 1 is a schematic of one embodiment of the invention depicting the light source and detector, and the other major components of the system.

A schematic of one embodiment of the measurement apparatus 10, depicting the light source 12 and detector assembly 26 in diffuse scattering reflectance geometry, in relation to a deposition chamber 16, is shown in FIG. 1. The system comprises a broad band light source 12 mounted in proximity to a transparent view port 18 on the chamber. The light source 12 is typically a quartz halogen lamp, mounted outside the deposition chamber 16 which illuminates a semiconductor wafer 20 (ghost lines in this view) from its front (polished) surface 22. The apparatus also comprises a detector assembly 26, also mounted outside the deposition chamber 16 proximate to a transparent view port 18 at an angle that is non-specular to the light source 12; an optical fiber assembly 27, including a first optical fiber 28 coupled to an array spectrometer 32, and a second optical fiber 30 running collinear to first optical fiber 28 and coupled to a visible alignment laser 34 for aid in alignment of the detector assembly 26. The optical components are optimized, using appropriate optical coatings, for either infrared or visible operation depending on the characteristics of the wafer 20 being measured. The light source 12 is connected to control assembly 35, containing light source power and control unit 36 via light source power/data cable 38. Computer control of the light source 12, alignment laser 34 and spectrometer 32 is maintained by computer 40 which is connected to light source 12, alignment laser 34 and spectrometer 32 by USB cable 42.

Typically the back surface 24 of a semiconductor wafer 20 is optically rough and can act as a diffuse scattering surface for the light source 12. If both sides of the wafer 20 are polished, which is sometimes the case, a diffuser (e.g., pyrolytic boron nitride) can be inserted between the back surface 24 of the wafer 20 and the substrate heater 46 to enhance diffuse scattering, but this is not a requirement. Light is diffusely scattered from the surfaces 22, 24 and from within the bulk of the wafer 20, a portion of which light is scattered in the direction of the detector assembly 26, and is imaged onto the entrance face of the optical fiber 28. The light is analyzed by the solid state array spectrometer 32.

Figure 2:
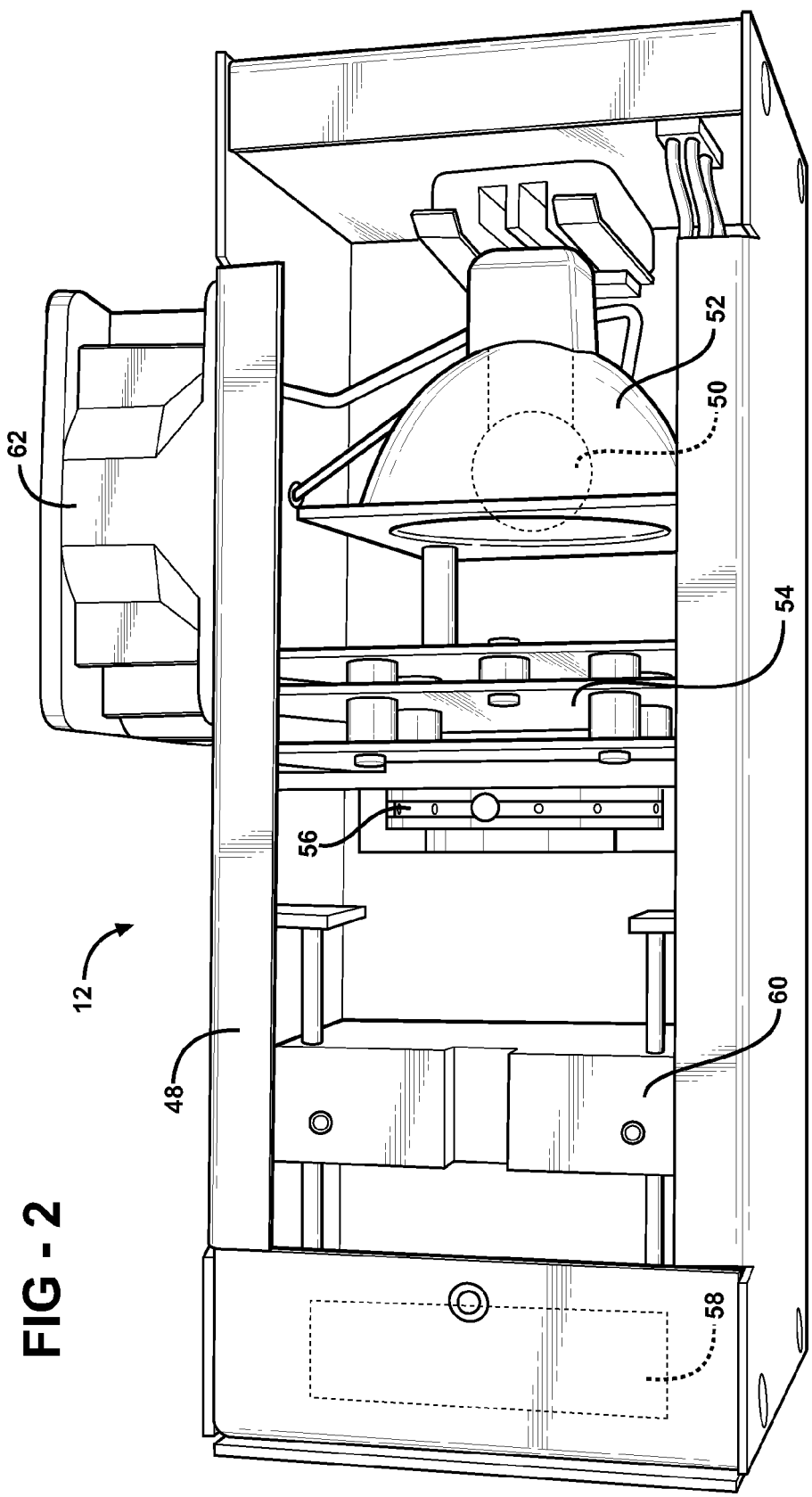
FIG. 2 is a top perspective view of the variable focus quartz halogen light source with the respective placement of the optics, components, and light intensity feedback sensor.

The first step in operation of the invention is to optimize the optics configuration (light source, collection optics and spectrometer) for the wavelength range required for the wafer substrate material. FIG. 2 is a top perspective view of the variable focus, 150 W quartz halogen light source 12 with the respective placement of the optics, components, and light intensity feedback sensor 54. The light source 12 components are mounted to enclosure 48. The light source 12 is optimized for either visible or infrared output depending on the substrate material to be measured. This involves selecting an appropriate bulb 50 for the source with either an enhanced visible or infrared coating on the lamp reflector 52. The bulbs 50 are readily available from several vendors, as are suitable infrared collimating reflectors. In the preferred embodiment, additional coatings, such as gold coatings for infrared optimization, are added to the lamp reflector 52. The light source 12 is driven by a computer-controlled 200 W power supply 36 with an integrated feedback control circuit that is connected to a light feedback sensor 54 mounted in the vicinity of the bulb 50. The purpose of the sensor 54 and feedback control circuit is to maintain the bulb output at a constant value, variable by computer 40 control, for the duration of the bulb lifetime. Without the feedback control circuit the output of the bulb 50 exhibits oscillations and the overall output slowly decreases over the lifetime of the bulb 50. A variable aperture 56 within the light source 12 controls the size of the spot of light illuminating the semiconductor wafer 20. The light is focused onto the wafer 20 using a pair of lenses, one fixed lens 58, the other variable focusing lens 60 variable in position to obtain the best focus at the wafer surface. The depth of field is sufficient for use on most deposition systems. The lenses 58, 60 are coated with a broadband antireflection coating to minimize back reflections, hence maximizing the output of the light source. Because of the high heat output of acceptable bulb/reflector combinations, a fan 62 is providing for cooling the light source 12.

Shown in FIG. 3 is a top perspective view of one embodiment of the detector assembly 26. The assembly 26 mounts outside of the deposition system to a transparent view port 18 on the chamber 16, allowing the optics to remain clean and uncoated. The components of the detector assembly 26 are mounted to frame 63. A first detector lens 64 collects the diffusely scattered light and collimates it into the second detector lens 66. The second lens 66 images the light onto the optical fiber assembly 27 containing single-core optical collection fiber 28. The lenses 64, 66 are coated with a broadband anti-reflection coating to minimize signal loss at the lens surfaces. The position of the second lens 66 can be adjusted to obtain the best focus at the fiber face 68. The optical fiber 28 can also be positioned, utilizing an adjustor 72, in x, y and z directions to assist in maximizing the amount of light collected into the fiber. This particular embodiment of the detector assembly 26 also comprises a micrometer-actuated, single-axis tilt mechanism 70 built into the front of the assembly 26 to assist in pointing the detector at the wafer 20 within the chamber 16.

A second embodiment of the detector assembly 26a, shown in FIG. 4, uses a short focal length focusing mirror 74 mounted to support 75 to collect and focus the diffusely scattered light onto the first optical fiber assembly 27. This detector assembly 26a design also mounts outside the deposition chamber 16 and the coatings on the minor 74 are optimized for the wavelength range required for the particular substrate material. The advantage of using a mirror 74 is that reflection losses from the surfaces of lenses are eliminated completely and all wavelengths of light are focused to same point, thus maximizing the collection efficiency. The disadvantage is that the overall size of the detector assembly is larger.

The single small core optical fiber 28 component within fiber optic assembly 27 used to connect the detector assembly 26 or 26a to the spectrometer 32 eliminates many of the shortcomings of the present fiber bundle methods and apparatus in use. It is well known that fiber bundles have significant optical losses which are associated with the empty spaces which exist between adjoining fibers within the same bundle. Further, the existence of multiple fibers increases the susceptibility of the bundle to interference from stray light. It is equally well known that optical fibers have a predetermined "acceptance angle" and that economically practical optical fibers generally have a predetermined acceptance angle with a tolerance of + or −2 degrees. While these tolerances are satisfactory in the case of single fiber optics, optical fiber bundles containing dozens of individual optical fibers and are much more susceptible to stray light, with the susceptibility increasing as the number in the bundle increases. The most important advantage of a single fiber is the spatial selectivity afforded by their small aperture (~400 μm). This is important for stray light rejection. Additionally, optical fiber bundles are relatively expensive, typically in a range of $300 to $400 per foot. Single optical fiber of approximately 400 micron cross-section, on the other hand, costs less than $10 per foot.

With reference to FIG. 1, the fiber optic assembly 27 used in the invention is a dual, bifurcated silica/silica fiber selected for maximum transmission in the wavelength range required by the particular semiconductor material. One optical fiber core of the bifurcated fiber is used for collecting light from the lenses within the detector. The other optical fiber core is used to transmit laser light from a red visible semiconductor diode alignment laser 34 to the semiconductor wafer 20, for use in alignment of the detector assembly 26. When the detector assembly 26 is first attached to the deposition system, the alignment laser 34 can be activated to produce a visible red laser spot illuminating the region where the detector assembly 26 is aimed. The use a small single core fiber for light detection allows for very precise selectivity of the region or spot on the wafer 20 for the temperature measurement. The detector optics image an area of the wafer surface. The magnification of the system is defined by the focal length of the lenses and the position of the second (variable position) lens. The image of the wafer 20 at the face of the optical fiber is much larger than the diameter of the core. This allows the system to spatially resolve temperature across the wafer surface by either rotating the wafer or by moving the position of the fiber using the x, y adjustment within the detector assembly 26. Although it is not incorporated into the detector assembly 26 shown, it is possible to use automated actuators to scan the x, y-position of the fiber to create a 2-dimensional map of the wafer 20 surface temperature.

A principal component to realizing this invention is the very sensitive, fiber-coupled solid state array spectrometer 32. Solid state array spectrometers (having no moving parts) are becoming common in applications where speed and sensitivity are essential. Their drawback is modest resolution (~few nm in wavelength). This is not a limitation here, because the band-edge features are relatively broad and can be determined by fitting procedures to much greater precision than the spectrometer resolution. The use of a fiber-coupled array spectrometer 32 for this application has the following advantages:

a. Speed: array spectrometers measure typically 128-2048 wavelength channels simultaneously. Millisecond measurement times are possible.

b. Sensitivity: array spectrometers are very compact, promoting high light throughput (low numerical aperture: F1.8-F3.0 is typical). For InGaAs arrays, 1000 ADU/sec/picowatt at 1200 nm is a typical sensitivity.

c. Wide spectral range: with careful selection of the spectrometer grating one can cover the entire spectral range required for this application (typically a wavelength range of ~300 nm would cover a temperature range from ambient to ~700° C.).

d. Infrared sensitivity: the most challenging aspect of band-edge thermometry concerns those semiconductors with small band gaps, in the infrared region. Commercial array spectrometers with InGaAs photo diode arrays have recently become available at reasonable cost. Conventional InGaAs arrays extend the spectral range beyond that offered by conventional Si CCD arrays (~250-1100 nm) up to 1700 nm. This opens up a wider range of semiconductors to band-edge thermometry.

e. Spatial selectivity: when used with fiber-optic coupling, array spectrometers have excellent rejection of stray light signals. This is because the fiber core can range from 50 um to 800 um (matched to the spectrometer numerical aperture). Therefore, by imaging the light scattered from the illuminated portion of the wafer 20 onto the fiber entrance core, it is possible to eliminate stray light that originates elsewhere in the vacuum chamber (hot evaporation sources, gauge filaments, etc.).

The array spectrometer 32 used in this invention has sufficient speed and sensitivity and to allow the collection of complete spectra from the semiconductor wafer 20 at typical data rates of 20 Hz and can exceed 50 Hz if required.

Figure 5A:
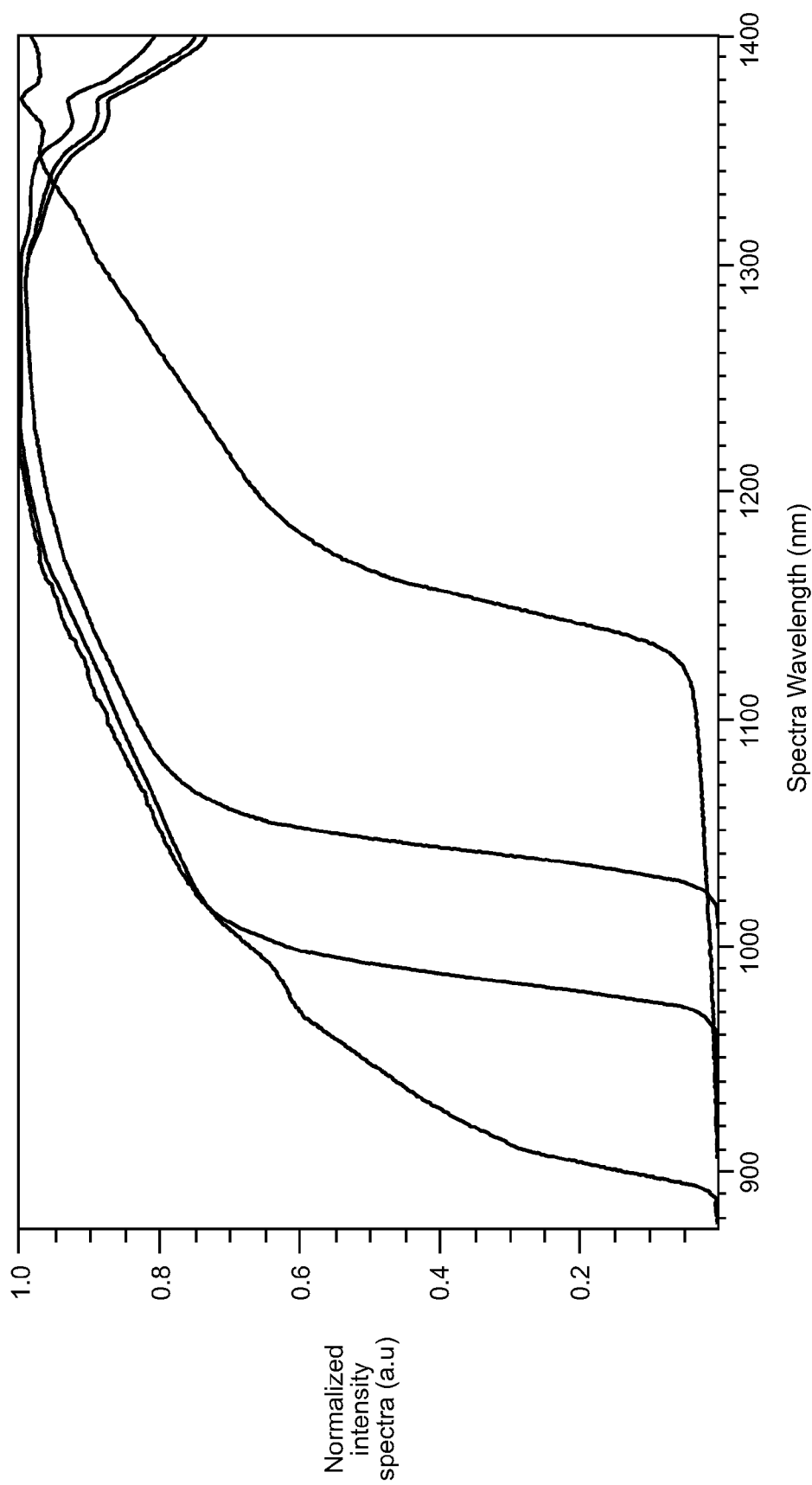
FIG. 5A is a graph showing the raw, unprocessed, diffusely scattered light spectra from a typical semiconductor wafer at several predetermined wafer temperatures demonstrating the wavelength dependence of the absorption edge on temperature.
Figure 6:
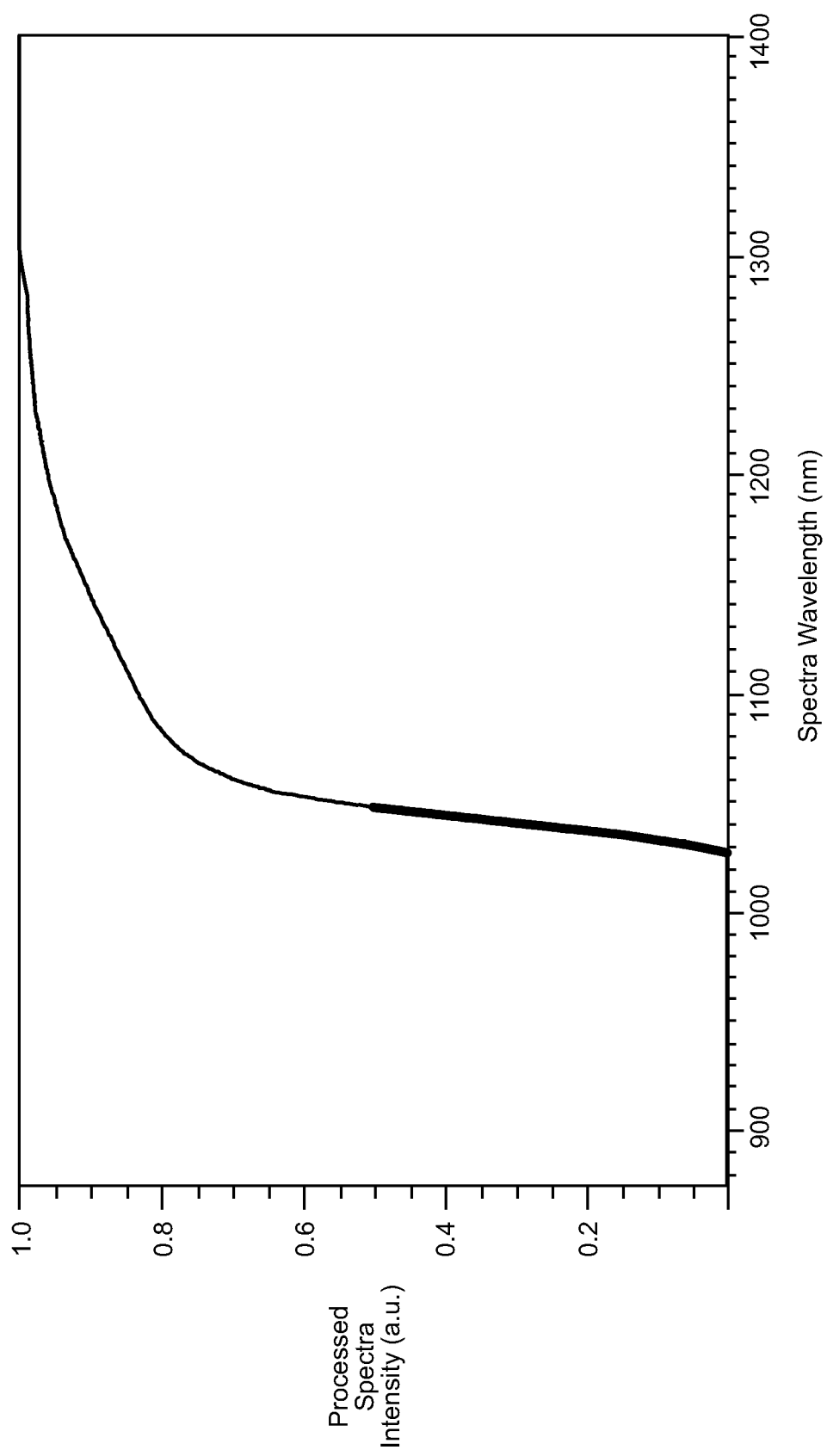
FIG. 6 is a graph showing the diffusely scattered light spectrum after it has been fully processed and a linear fit has been performed in the region of the absorption edge to determine the exact absorption edge wavelength.

Shown in FIG. 5A is an example of diffuse reflectance spectra collected from a semiconductor wafer 20 at four different predetermined temperatures. The spectra as shown are unprocessed, "raw" spectra. The band edge absorption is clearly visible at each temperature. Shown in FIG. 5B are the same spectra after they have been pre-processed by software routines to remove unwanted background light below the absorption edge and normalize the maximum intensity. An example of a fully processed spectrum showing a linear fit to the absorption edge is shown in FIG. 6. The fit to the linear portion of the absorption edge in the spectra is extrapolated back to the x-axis to provide a highly accurate and reproducible wavelength value for the band-edge. This wavelength value is then correlated to the sample temperature.

Figure 7:
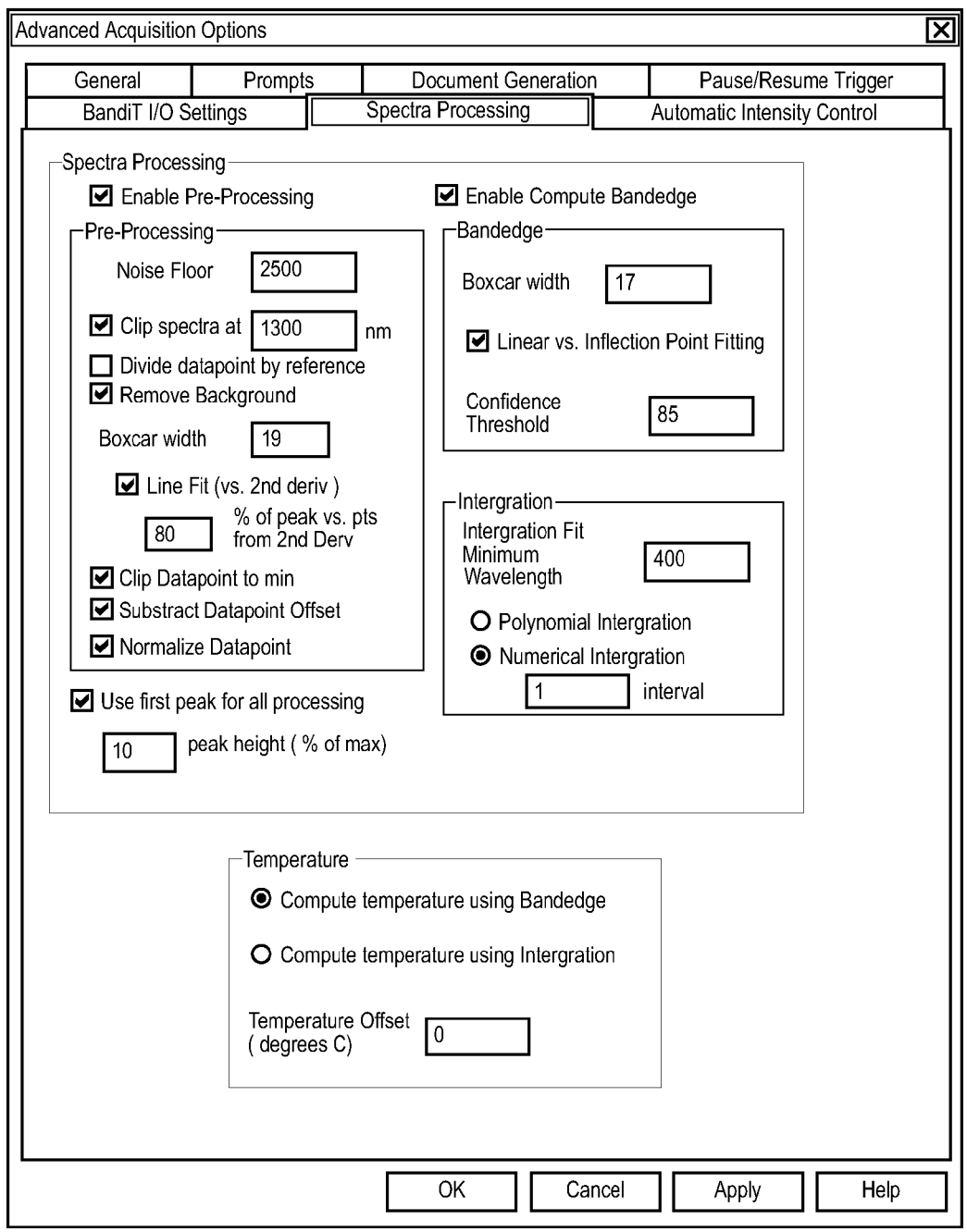
FIG. 7 shows the spectra processing configuration dialog from the software user interface.

The software algorithms used to process the spectra and correlate the band-edge wavelength to a temperature can be dependent on the type of semiconductor wafer material as well as the specific geometry of the deposition chamber. Every deposition chamber is slightly different and can produce different artifacts into the raw spectra signal. The software processing algorithms must be flexible to handle many applications. Shown in FIG. 7 is the Spectra Processing Software Dialog from the system software. The specific steps in the spectra preprocessing and final absorption band-edge computation processing are described below.

Preprocessing:

Noise Floor: allows the system to be configured to ignore a specific level of light deemed noise based on experimental conditions. If no portion of the current spectrum is above the noise floor, the system ignores the spectrum and collects another spectrum.

Clip spectra: removes expected anomalies in data beyond the absorption band-edge and provides a consistent wavelength position for normalizing the spectra.

Divide data point by reference: divides a reference lamp spectrum from the collected spectrum to remove any unwanted features introduced by the lamp.

Remove Background: using derivative calculations, the parameters under this heading configure how the system will remove black body radiation or other unwanted light from each collected spectrum. The derivative of a spectrum is first smoothed to enhance broad features and remove narrow features. The point of interest within the derivative is then determined by one of two methods, 1) a linear fit to the peak of the $1^{st}$ derivative that satisfies a specified height; or 2) an offset from the peak of the $2^{nd}$ derivative. The wavelength of this POI is used to find the background level of light. This background level is then subtracted from the spectrum.

Clip data point to min.: all wavelength data below the wavelength with the minimum intensity is set to the minimum intensity value. This creates a flat line up to the wavelength with the minimum value.

Subtract data point offset: subtracts the minimum intensity value determined in the previous step from the entire spectrum.

Compute Bandedge: Preprocessed spectra are smoothed further to enhance broad features and remove narrow features. The absorption edge is then computed in one of two ways; 1) the x-intercept using a linear fit at the wavelength position of the peak of the $1^{st}$ derivative, or 2) wavelength position of the peak of the $1^{st}$ derivative.

Figure 8:
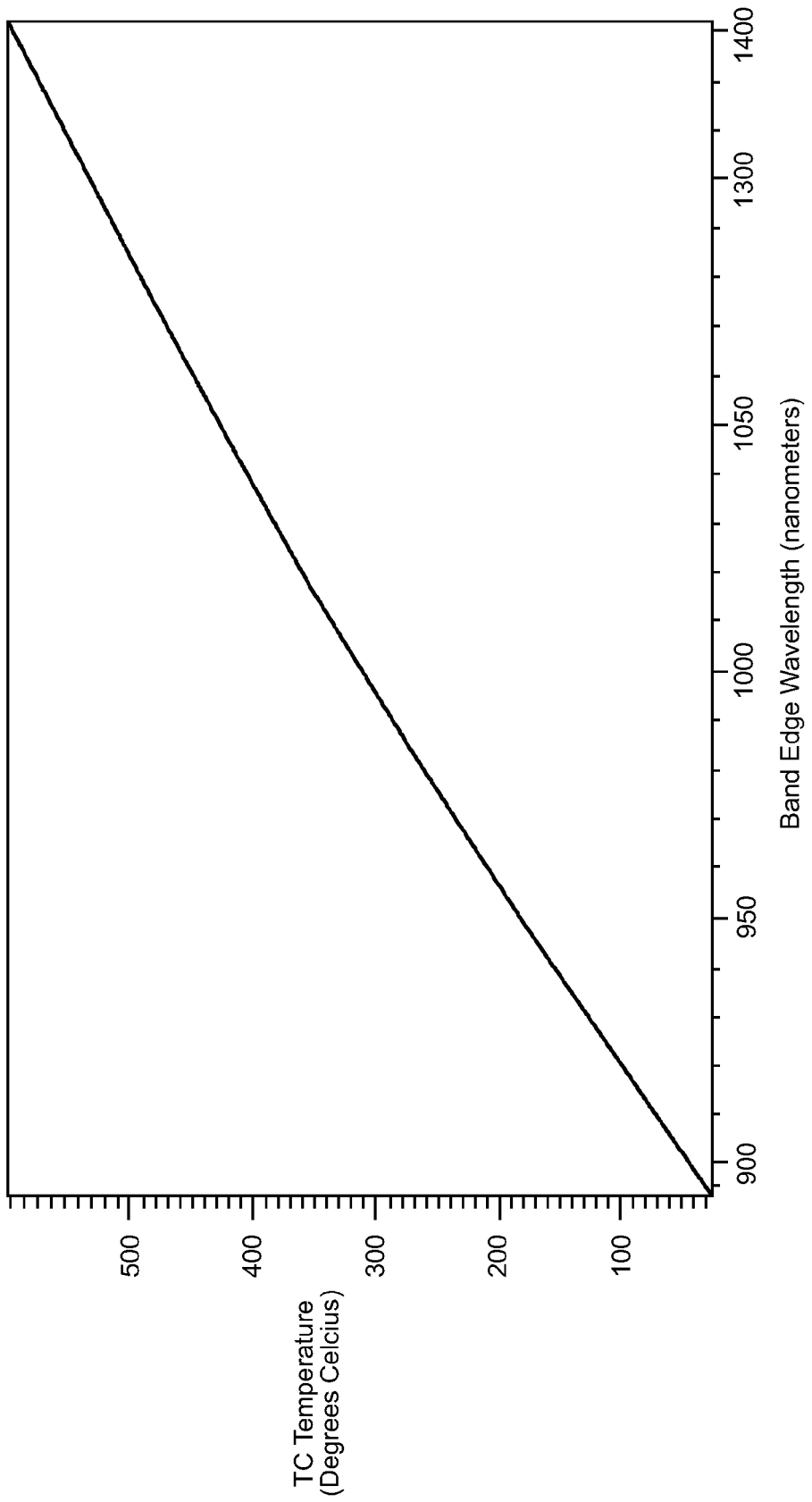
FIG. 8 is graph showing the typical measured relationship for the absorption edge wavelength position versus wafer temperature measured by a thermocouple in direct contact with the surface of the wafer.
Figure 9:
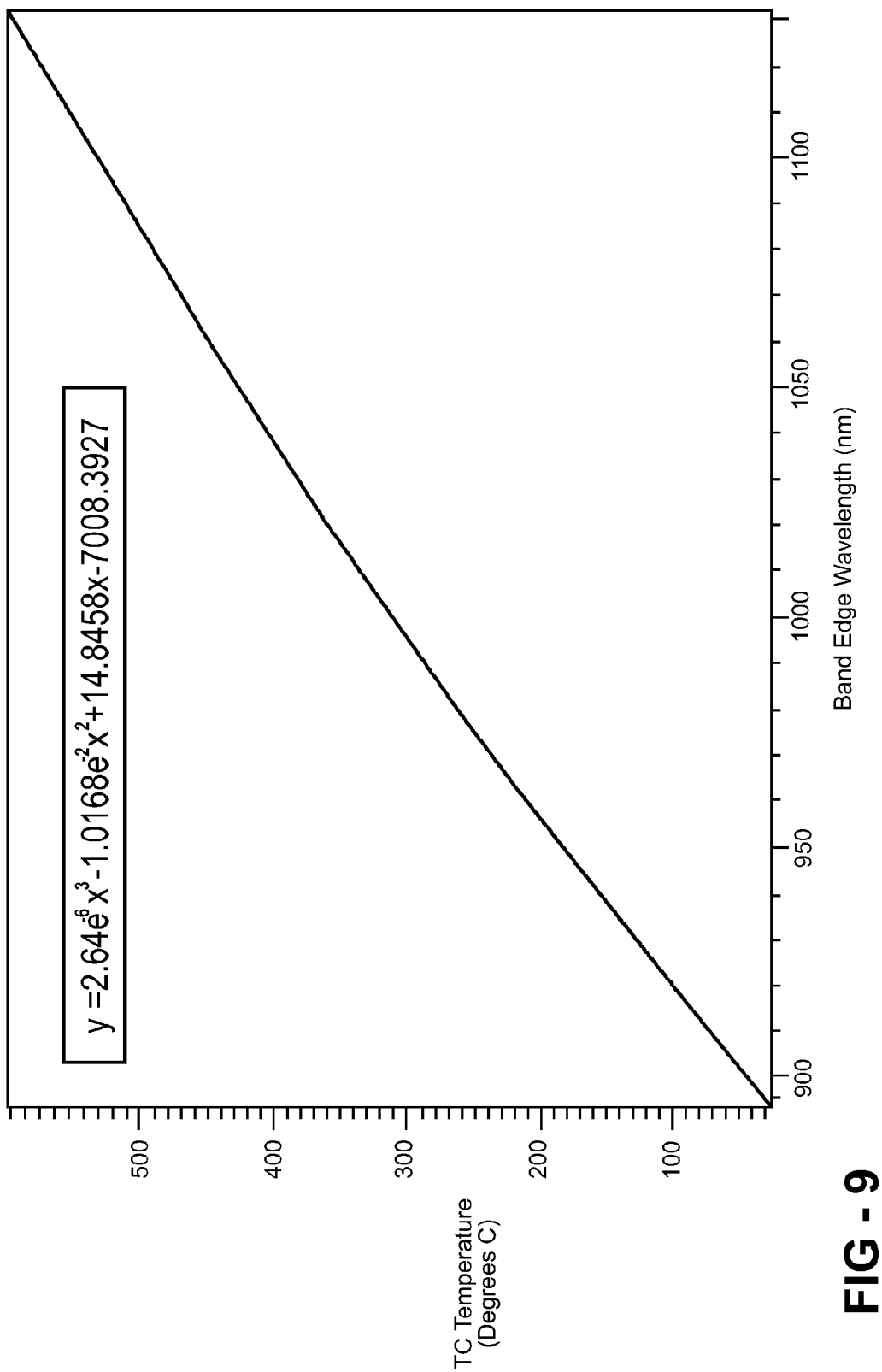
FIG. 9 is a graph showing a multi-order polynomial fit to the absorption edge wavelength position versus sample temperature data.

The preprocessing steps outlined above allow the system to accurately and reproducibly determine an absorption band edge wavelength from a given spectrum. This wavelength is then correlated to a wafer temperature through the use of calibration files. Calibration data is obtained by collecting spectra from semiconductor wafers at well known temperatures. The temperature of the wafer 20 is measured by a thermocouple in direct contact with the wafer surface. A typical calibration data file, shown in FIG. 8, depicts the absorption band-edge wavelength versus thermocouple (TC) temperature. The wavelength versus TC temperature plot is slightly non-linear at low temperature but becomes very linear, as predicted, at high temperature. Shown in FIG. 9 is the third order polynomial fit to the data with the polynomial coefficients computed and displayed at the top of the graph. The second and third order polynomial coefficients are quite small. The software uses the computed polynomial to relate the computed absorption band-edge wavelength to a wafer 20 temperature.

Figure 10:
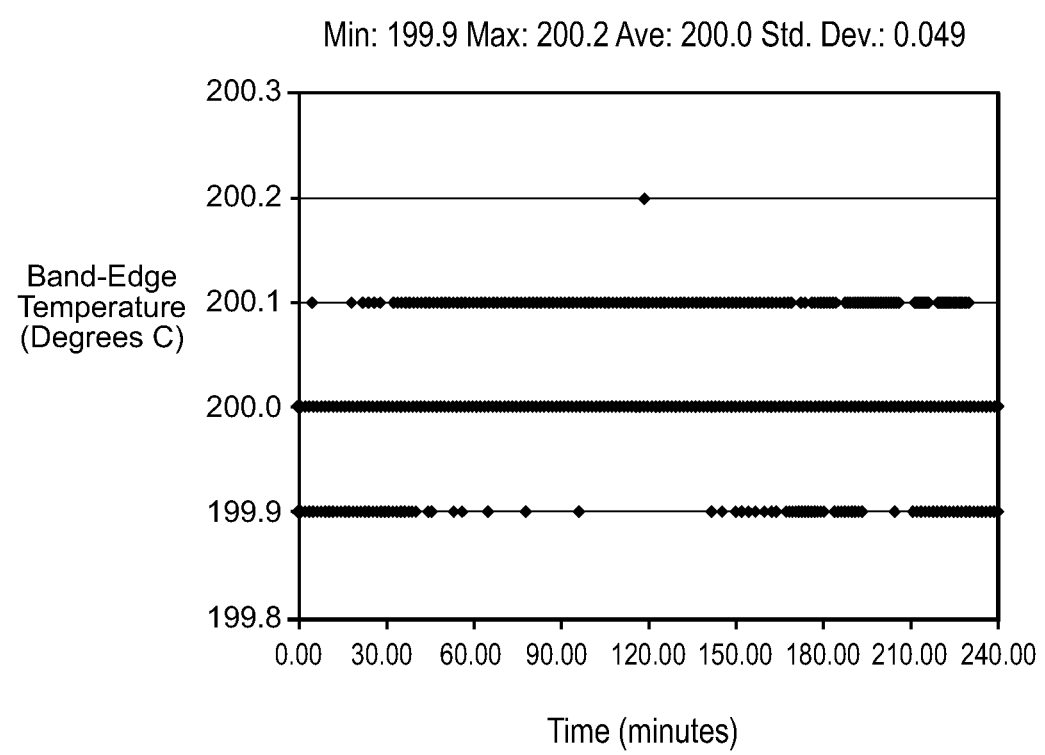
FIG. 10 is a graph showing the long term stability of the temperature measurement apparatus at a single predetermined wafer temperature.

The absorption wavelength versus temperature calibration depends not only on the semiconductor material, e.g. Si, GaAs, InP, but also very strongly on the wafer 20 thickness, dopant type, and dopant density. This requires that calibration files must be acquired for wafers 20 of different thickness, dopant type, and dopant density. Once calibration files have been acquired for several variations that establish a trend, for example the shift in absorption edge due to wafer 20 thickness, the software can compute calibration curves for modifications. When the proper calibration file is selected, corresponding to the correct wafer material, wafer thickness and dopant density, the system can precisely and reproducibly measure the wafer temperature with high accuracy. Shown in FIG. 10 is a long term stability plot for repeated measurement of a semiconductor wafer 20 over a four hour period. The wafer 20 was held at 200.0+/−0.1 degrees Celsius using a PID temperature controller with a calibrated thermocouple mounted directly to the wafer 20 surface. The plot shows that the absorption band-edge measurement was repeatable with a maximum error of 0.1 degrees Celsius and a standard deviation over a four hour period of 0.04 degrees Celsius.

Figure 11A:
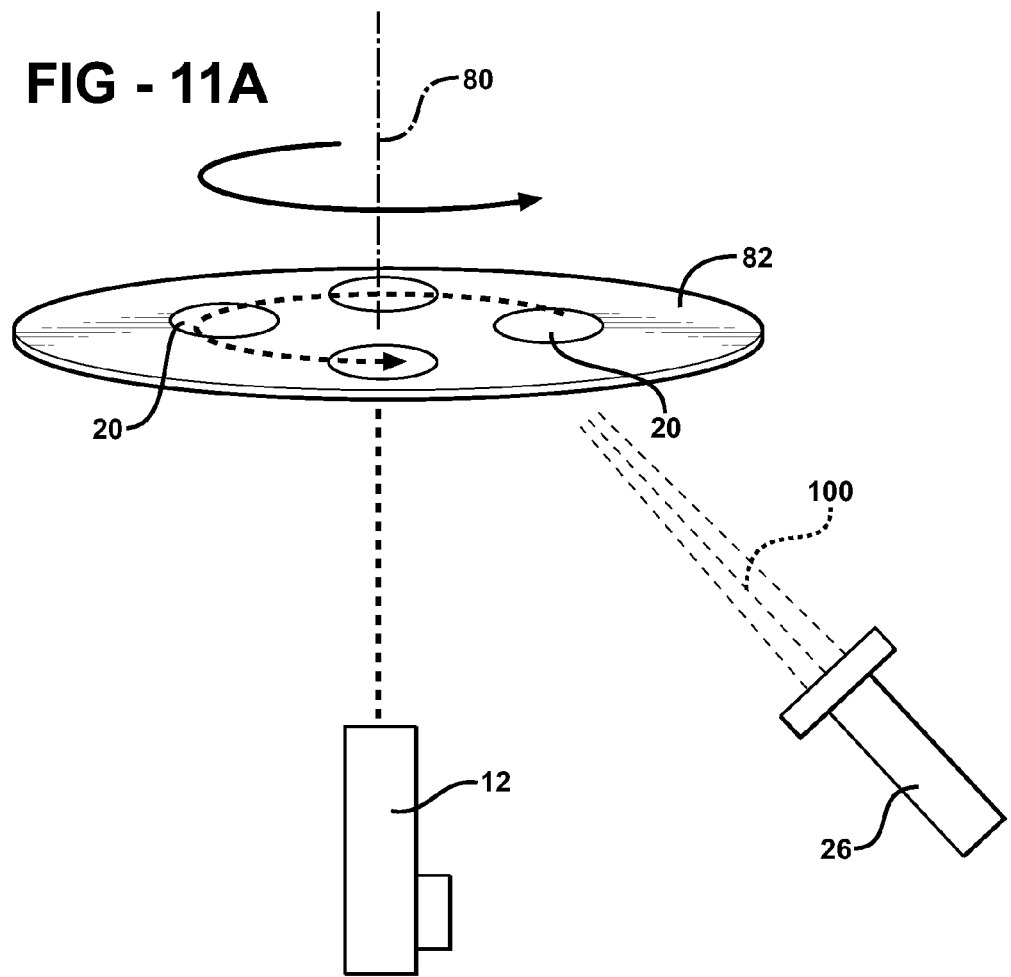
FIG. 11A and 11B are simplified schematic drawings of the apparatus in a multi-wafer deposition system demonstrating the geometry for measurement of multiple wafers on a rotating wafer platen.
Figure 11B:
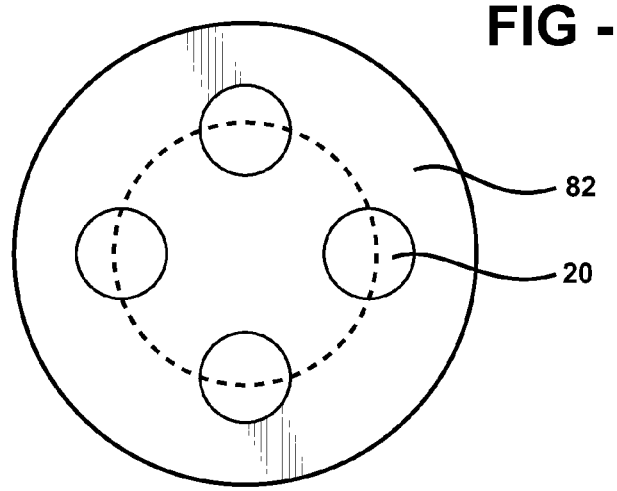
Figure 12:
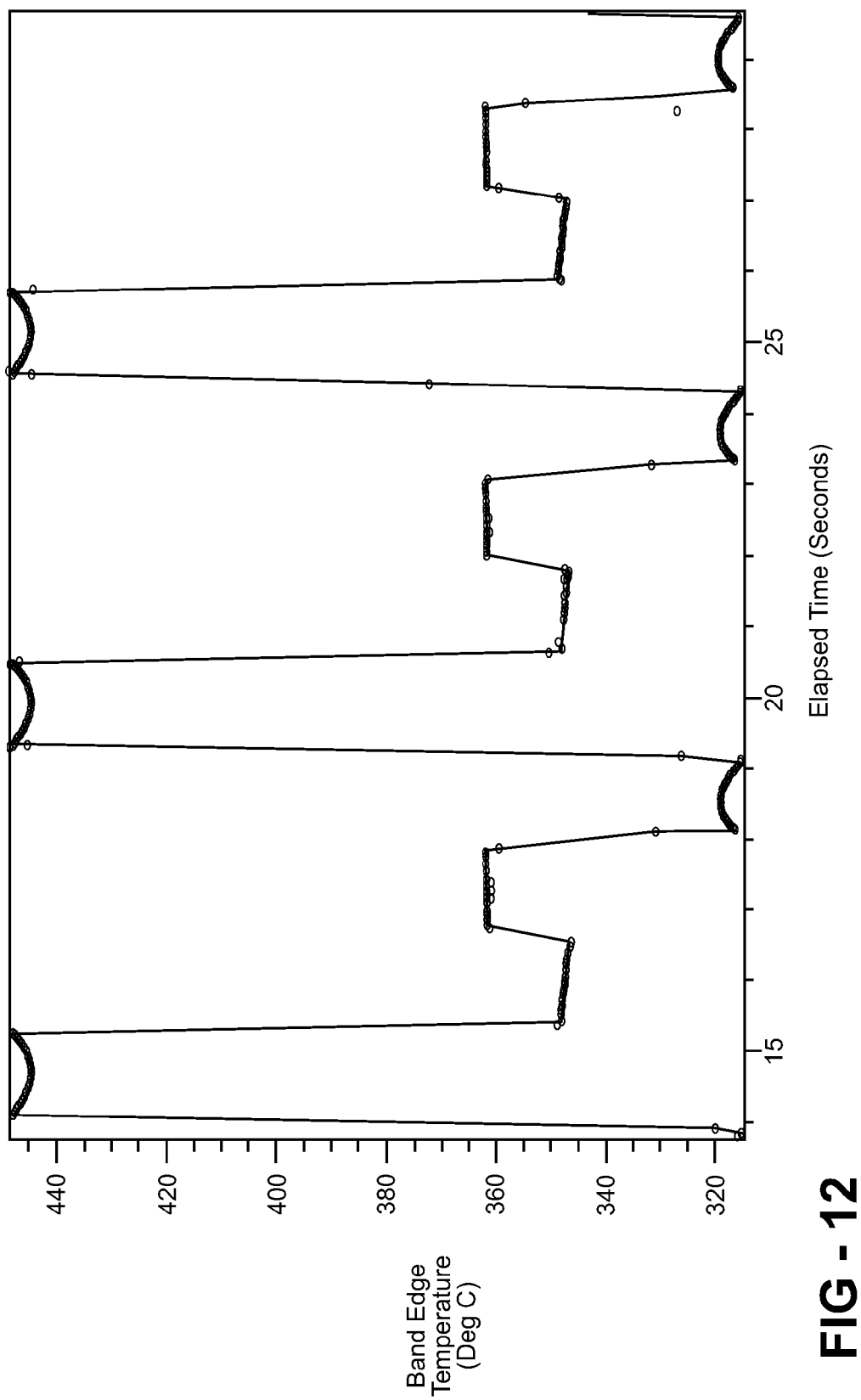
FIG. 12 is a graph showing typical temperature data obtained from a rotating platen of multiple semiconductor wafers in a multi-wafer deposition system.
Figure 13:
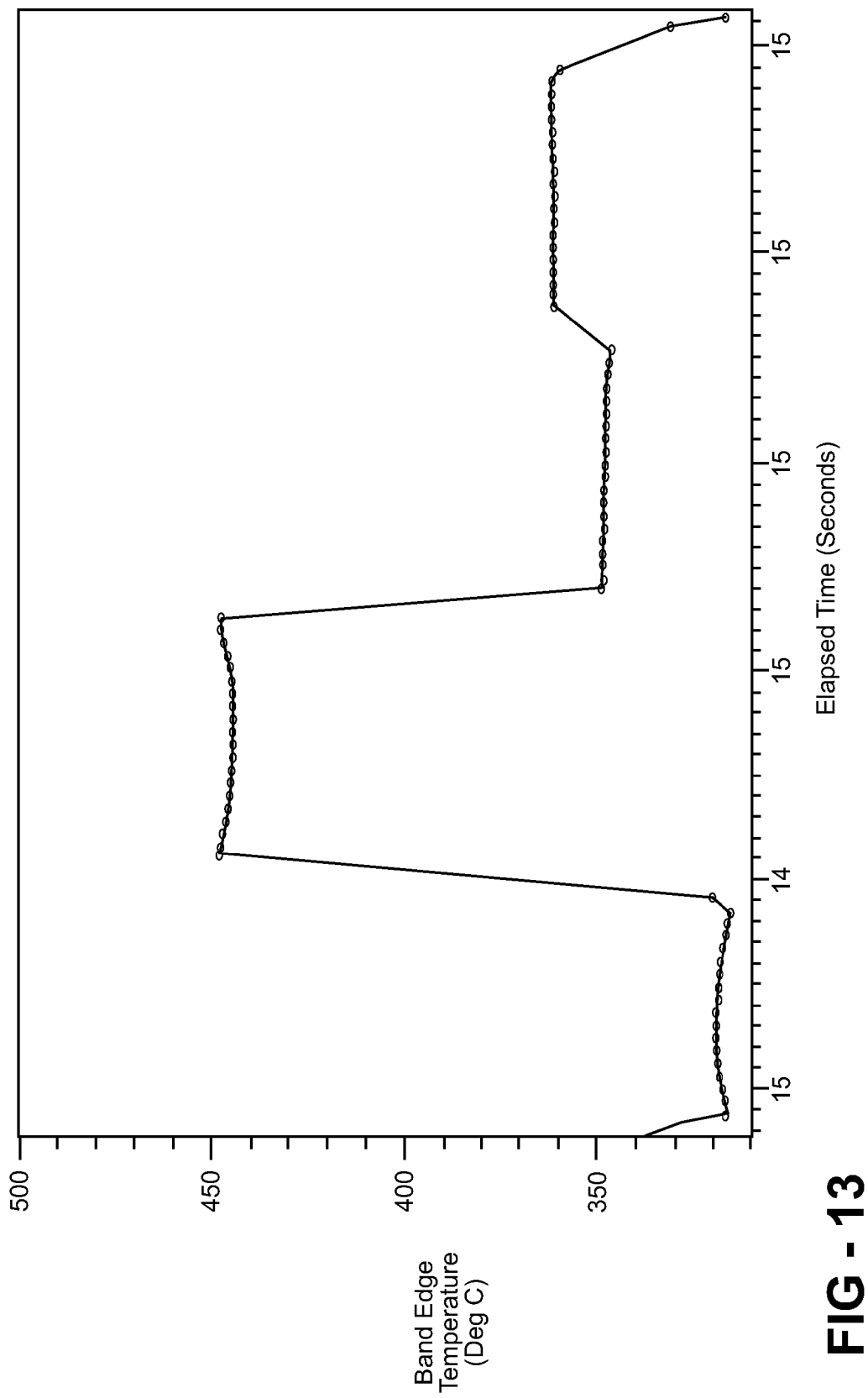
FIG. 13 is a detailed graph showing the variation in temperature across the surface of multiple wafers in a multi-wafer deposition system after a single rotation.

FIGS. 11A and 11B show a typical application of the invention to a multi-wafer production deposition system. Multiple wafers 20 are mounted on a platen 82 that rotates about a central axis 80. The light source 12 is positioned on the outside of chamber 16 so that as the platen 82 rotates, each wafer 20 individually passes beneath the light source 12. The diffusely scattered light 100 is detected from a port of chamber 16. Platen 82 rotation speeds can be as high as 60 RPM resulting in each wafer 20 being illuminated by the light source 12 for as little as 50 ms. The measurement speed of the invention is thus essential if every wafer 20 is to be measured with each rotation. An example of actual temperature data from a commercial production deposition system is shown in FIG. 12. As shown in FIG. 11B, the wafer platen 82 holds 4, 6-inch diameter wafers 20 and the invention is measuring each wafer 20 on the platen 82 repeatedly as the platen 82 rotates. Each wafer temperature is shown to be highly repeatable and if the data is analyzed in detail, as shown in FIG. 13, it can be seen that the invention can spatially resolve the temperature across each wafer 20. The measurement shows that some wafers have a much larger temperature gradient than others. One wafer 20 is much hotter at the center while another is much hotter at the edges. This type of temperature non-uniformity can cause significant differences in device performance depending on where the device originates from the wafer 20.

Figure 14:
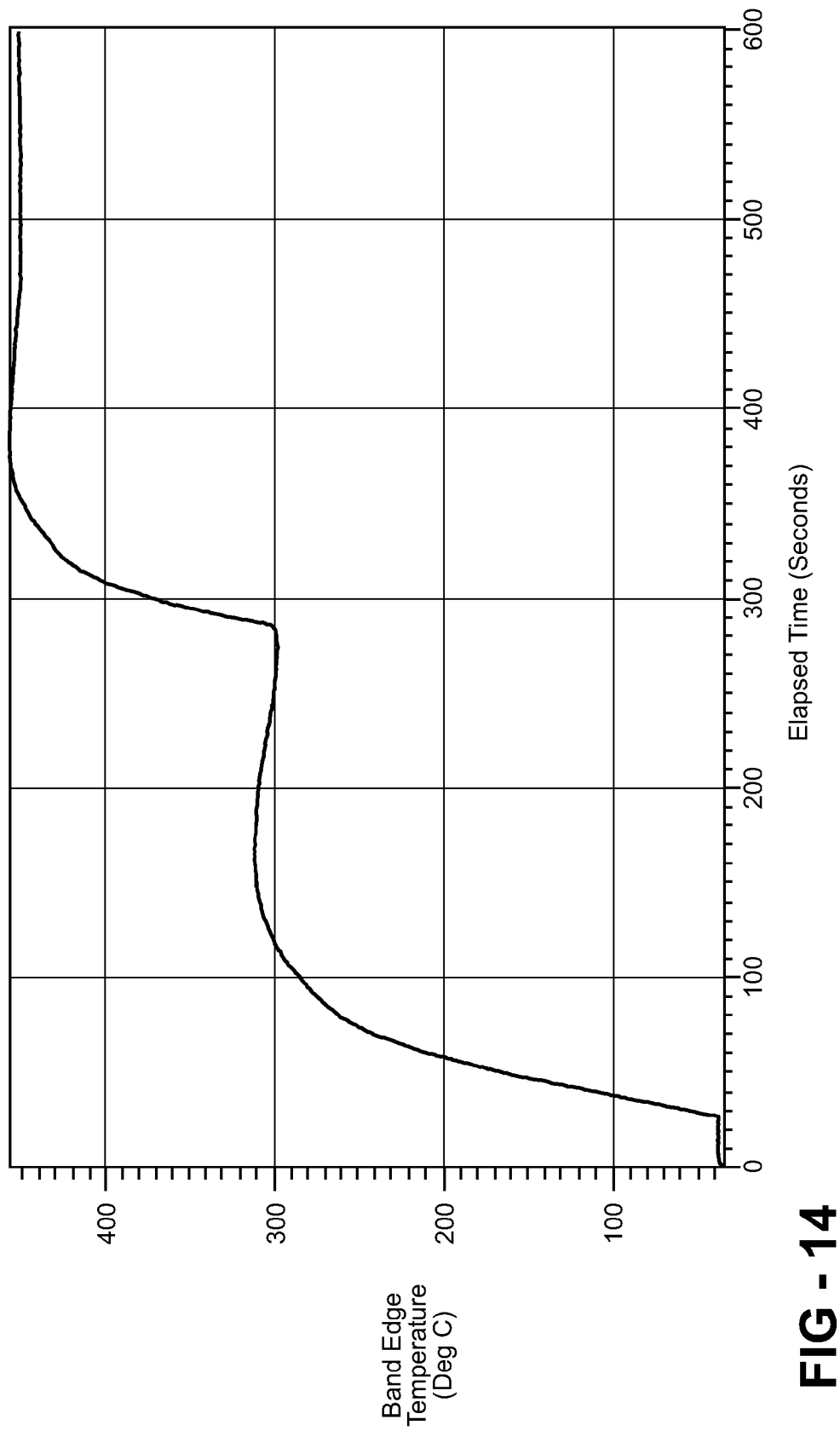
FIG. 14 is a graph showing the measured band-edge wafer temperature as a function of time as the wafer set point temperature is first set to 300 degrees Celsius, then 450 degrees Celsius.
Figure 15:
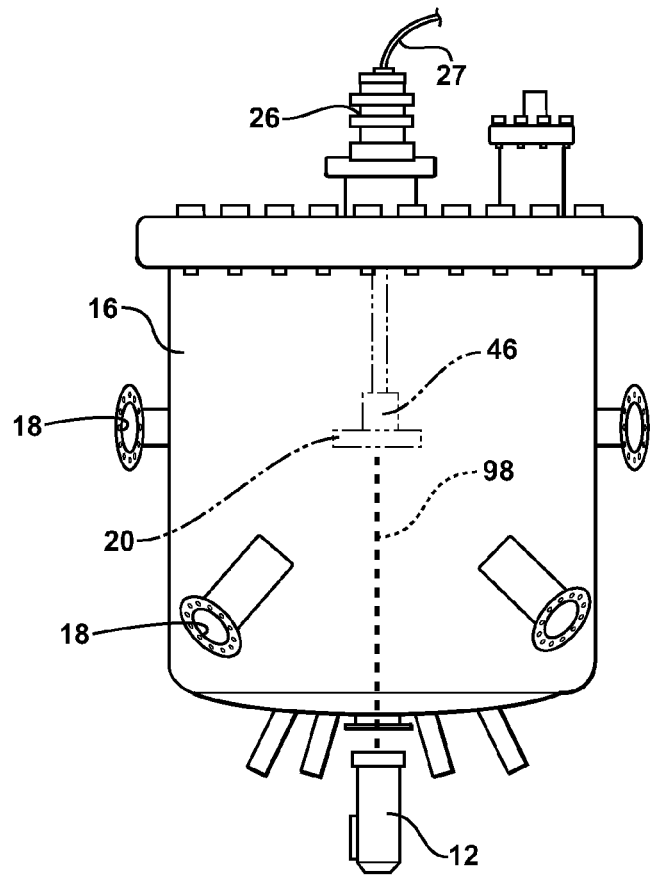
FIG. 15 is a schematic of a second embodiment of the invention depicting the substrate heater as the light source and the detector, in transmission geometry, in relation to a deposition chamber.

The described invention has sufficient speed and accuracy that the band-edge wafer 20 temperature signal can be used as an input to a proportional-integral-differential (PID) control loop for the purpose of controlling the output power of the substrate heater. Shown in FIG. 14 is a graph of the wafer 20 temperature as a function of time, measured using the band-edge absorption signal in a direct feedback loop to a PID controller. The temperature ramps and stabilizes very quickly to the set point values of 300 degrees Celsius and 450 degrees Celsius respectively.

Figure 16:
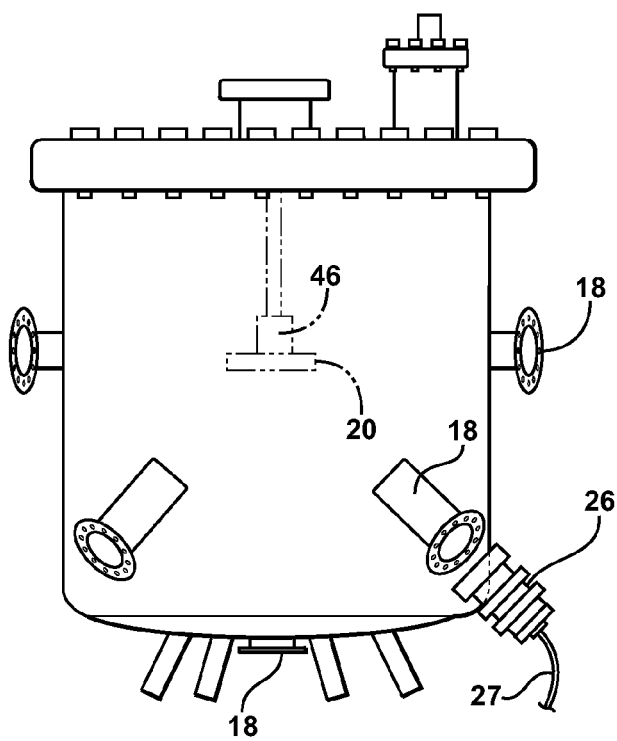
FIG. 16 is a schematic of a third embodiment of the invention depicting the detector, in transmission geometry, in relation to an external light source.

In further embodiments of the invention, the system utilization can be extended by operating the system in transmittance rather than reflectance geometry. In a third embodiment of the invention, shown in FIG. 16, an external light source 12 can be mounted to illuminate either the front or back side of the wafer 20 and the detector assembly 26 can be mounted on the opposite side of the wafer 20 in a transmission geometry. In some applications where there is limited space behind the substrate heater 46, a quartz rod can be placed behind the wafer 20 to collect and redirect the transmitted light 98 to a suitable port where the detector can be mounted. Provided the quartz rod is located behind the wafer 20, it will not be coated by the deposition process. FIG. 16 is a schematic of a third embodiment of the invention depicting the detector assembly 26, in transmission geometry, utilizing the substrate heater 46, within the deposition chamber 16, as the source of light. In this geometry no external light source is required.

In conclusion, a new real-time, non-contact temperature measurement system has been described—for use in semiconductor growth and wafer processing applications. The invention is designed to overcome the limitations of existing technology to provide a versatile non-invasive temperature sensor for a much wider set of applications in the thin film semiconductor arena. Taking advantage of recent developments in fiber-coupled array spectrometers, the new invention provides a powerful tool to characterize multi-wafer temperature uniformity in production reactors, a measurement that cannot be performed currently with other temperature measurement techniques. Numerous obvious modifications may be made to the invention without departing from the scope thereof.

What is claimed is:

1. A method for determining the temperature of a semiconductor material via spectral analysis in an environment where there are light signals from wanted and unwanted sources, said method comprising the steps of:
   a) providing a semiconductor material;
   b) interacting light signals with the semiconductor material to produce diffusely scattered light;
   c) collecting light in a spectrometer to produce spectra data by resolving light signals into discrete wavelength components of particular light intensity, the light containing both diffusely scattered light from the semiconductor material along with a component of unwanted light signals;
   d) identifying an absorption edge feature in the spectra data;
   e) ignoring a predetermined level of light deemed noise based on experimental conditions;
   f) obtaining a reference lamp spectrum from a lamp;
   g) dividing a reference lamp spectrum from the collected light to remove any unwanted features introduced by a lamp; and
   h) removing unwanted light from the spectra data to create preprocessed spectra.

2. The method of claim 1 further including the steps of:
   creating a flat line up to the wavelength with the minimum value by setting a minimum intensity value; and
   subtracting the minimum intensity value from the spectra data to establish a data point offset.

3. The method of claim 1 further including the step of clipping the spectra data, and wherein said step of clipping the spectra data includes removing anomalies in the spectra data beyond the absorption edge and providing a consistent wavelength position for normalizing the spectra data.

4. The method of claim 1 wherein said step of removing unwanted light includes using a derivative calculation.

5. The method of claim 4 wherein said step of using a derivative calculation includes smoothing the spectra data to enhance broad features and remove narrow features.

6. The method of claim 5 wherein said step of using a derivative calculation includes determining a point of interest within the derivative.

7. The method of claim 6 wherein said step of determining the point of interest wavelength includes the steps of:
   calculating a 1st derivative of the spectra data;
   identifying a peak feature of the 1st derivative within the absorption edge region;
   making a linear fit to the absorption edge region at the wavelength position of the 1st derivative peak;
   extrapolating the linear fit to determine a wavelength position for subtraction of the unwanted light component.

8. The method of claim 6 wherein said step of determining a point of interest wavelength includes the steps of:
   calculating a 2nd derivative of the spectra data;
   identifying a peak feature of the 2nd derivative within the absorption edge region;
   using the spectra intensity value at the 2nd derivative peak, or the intensity value just prior to the 2nd derivative peak, as the unwanted light component to subtract.

9. The method of claim 1 further including the steps of:
   further smoothing the spectra data to enhance broad features and remove narrow features;
   computing a band edge wavelength value; and
   inferring a temperature of the semiconductor material based on the computed band edge wavelength value.

* * * * *